(12) United States Patent
Yamane et al.

(10) Patent No.: US 10,475,474 B2
(45) Date of Patent: *Nov. 12, 2019

(54) STORAGE ELEMENT

(71) Applicant: Sony Corporation, Tokyo (JP)

(72) Inventors: Kazutaka Yamane, Kanagawa (JP);
Masanori Hosomi, Tokyo (JP);
Hiroyuki Ohmori, Kanagawa (JP);
Kazuhiro Bessho, Kanagawa (JP);
Yutaka Higo, Kanagawa (JP); Tetsuya Asayama, Tokyo (JP); Hiroyuki Uchida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/997,868

(22) Filed: Jun. 5, 2018

(65) Prior Publication Data

US 2018/0286437 A1 Oct. 4, 2018

Related U.S. Application Data

(63) Continuation of application No. 15/141,241, filed on Apr. 28, 2016, now Pat. No. 9,997,179, which is a (Continued)

(30) Foreign Application Priority Data

Sep. 28, 2012 (JP) .................................. 2012-217702

(51) Int. Cl.
*G11B 5/31* (2006.01)
*G11B 5/39* (2006.01)
(Continued)

(52) U.S. Cl.
CPC .......... *G11B 5/3146* (2013.01); *G11B 5/1278* (2013.01); *G11B 5/3906* (2013.01);
(Continued)

(58) Field of Classification Search
CPC combination set(s) only.
See application file for complete search history.

(56) References Cited

U.S. PATENT DOCUMENTS

| 6,256,223 B1 | 7/2001 | Sun |
| 2007/0253122 A1* | 11/2007 | Fukuzawa .............. B82Y 10/00 360/324.11 |

FOREIGN PATENT DOCUMENTS

| JP | 2003-017782 | 1/2003 |
| JP | 2008-227388 | 9/2008 |

OTHER PUBLICATIONS

Berger, "Emission of spin waves by a magnetic multilayer traversed by a current", Physical Review B, Oct. 1, 1996, vol. 54, No. 13 (6 pages).
(Continued)

*Primary Examiner* — Marc Anthony Armand
(74) *Attorney, Agent, or Firm* — K&L Gates LLP

(57) ABSTRACT

A storage element is provided. The storage element includes a memory layer; a fixed magnetization layer; an intermediate layer including a non-magnetic material; wherein the intermediate layer is provided between the memory layer and the fixed magnetization layer; wherein the fixed magnetization layer includes at least a first magnetic layer, a second magnetic layer, and a non-magnetic layer, and wherein the first magnetic layer includes a CoFeB composition. A memory apparatus and a magnetic head are also provided.

18 Claims, 9 Drawing Sheets

Related U.S. Application Data continuation of application No. 14/429,230, filed as application No. PCT/JP2013/004806 on Aug. 9, 2013, now Pat. No. 9,343,657.

(51) Int. Cl.

| | | |
|---|---|---|
| *G11C 11/16* | (2006.01) | |
| *H01L 43/08* | (2006.01) | |
| *H01L 43/10* | (2006.01) | |
| *H01F 10/32* | (2006.01) | |
| *H01L 43/02* | (2006.01) | |
| *G11B 5/127* | (2006.01) | |
| *H01L 23/528* | (2006.01) | |
| *H01L 27/22* | (2006.01) | |
| *B82Y 25/00* | (2011.01) | |
| *H01F 10/12* | (2006.01) | |

(52) U.S. Cl.
CPC .......... *G11B 5/3909* (2013.01); *G11C 11/161* (2013.01); *H01F 10/3272* (2013.01); *H01F 10/3286* (2013.01); *H01L 23/528* (2013.01); *H01L 27/222* (2013.01); *H01L 43/02* (2013.01); *H01L 43/08* (2013.01); *H01L 43/10* (2013.01); *B82Y 25/00* (2013.01); *H01F 10/123* (2013.01); *H01F 10/329* (2013.01); *H01L 27/228* (2013.01)

(56) References Cited

OTHER PUBLICATIONS

Mangin et al., "Current-induced magnetization reversal in nanopillars with perpendicular anisotropy", Nature Materials, Mar. 2006, vol. 5 (6 pages).

Parkin, "Systematic Variation of the Strength and Oscillation Period of Indirect Magnetic Exchange Coupling through the 3d, 4d, and 5d Transition Metals", Physical Review Letters, Dec. 16, 1991, vol. 67, No. 25 (4 pages).

Slonczewski, "Current-driven excitation of magnetic multilayers", Journal of Magnetism and Magnetic Materials, 1996, vol. 159 (7 pages).

International Search Report and Written Opinion of the International Searching Authority issued in connection with International Patent Application No. PCT/JP2013/004806, dated Dec. 20, 2011 (10 pages).

* cited by examiner

[Fig. 1]
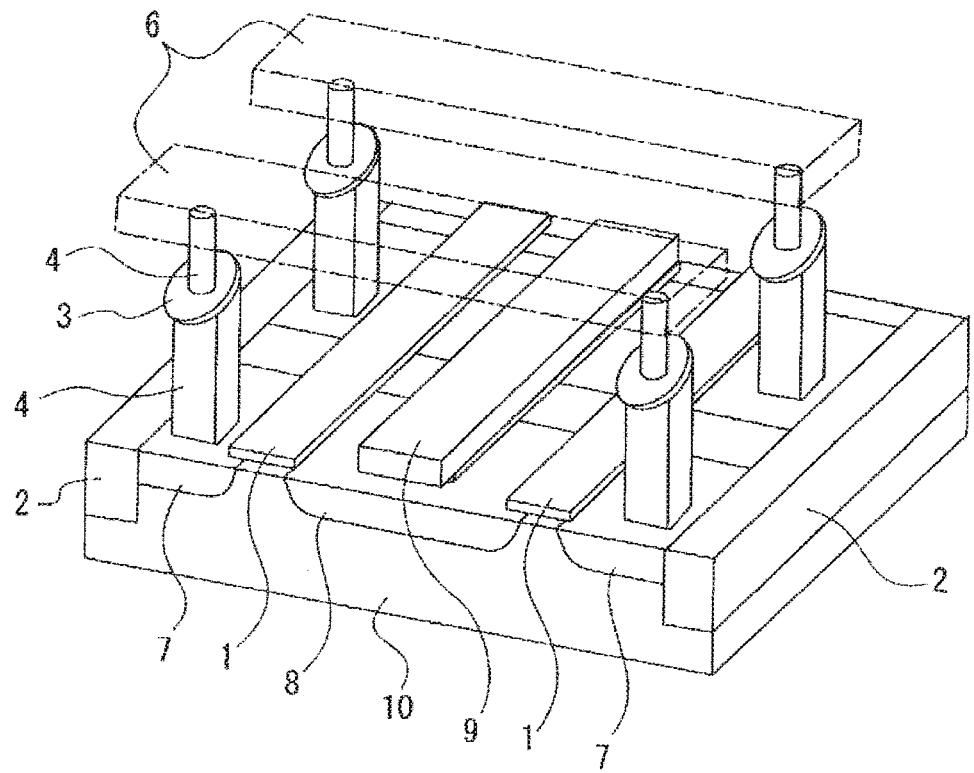
[Fig. 2]
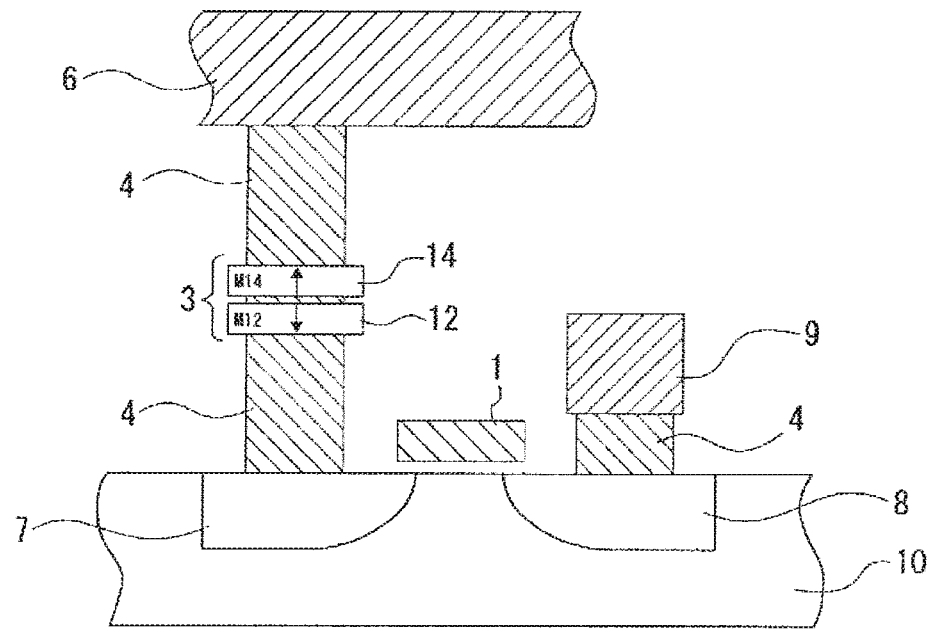

[Fig. 3]
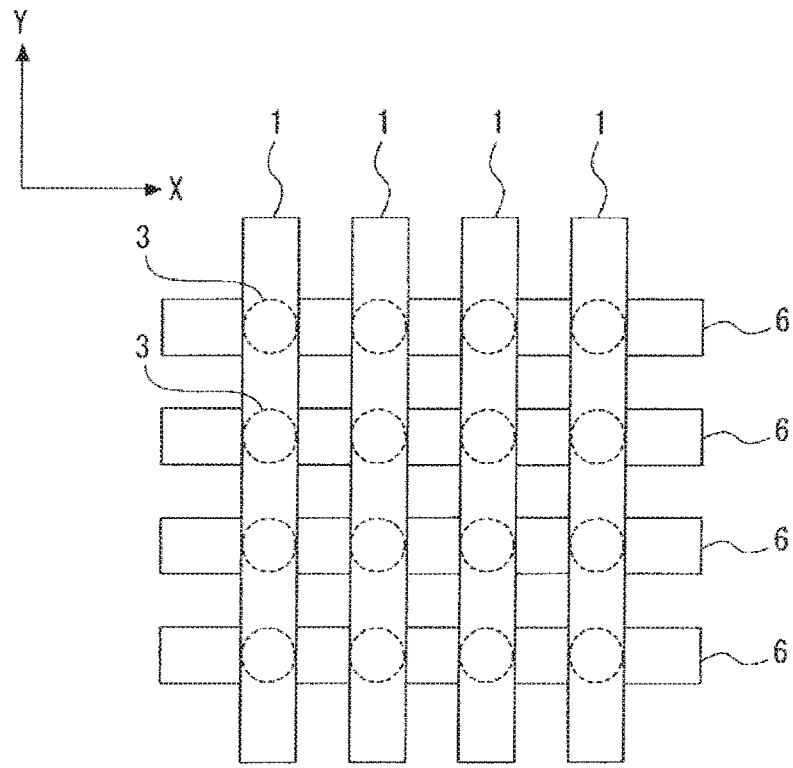
[Fig. 4]
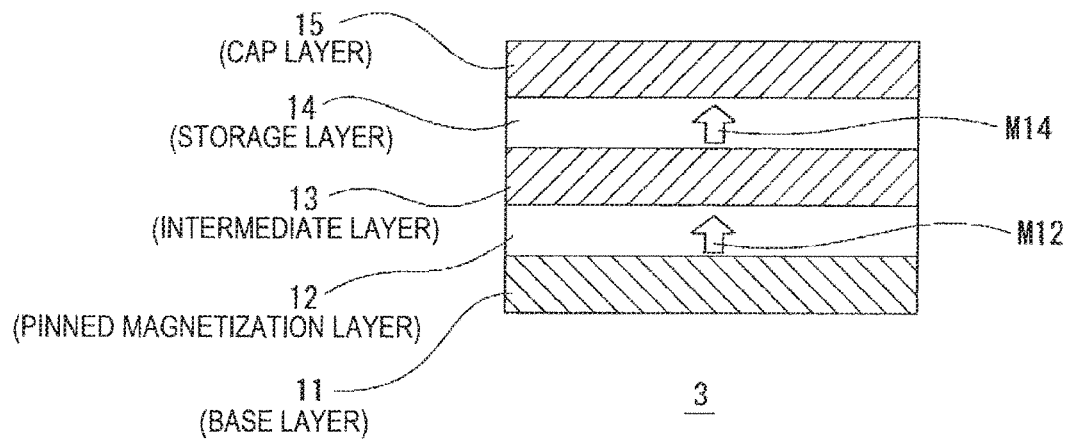

[Fig. 5]
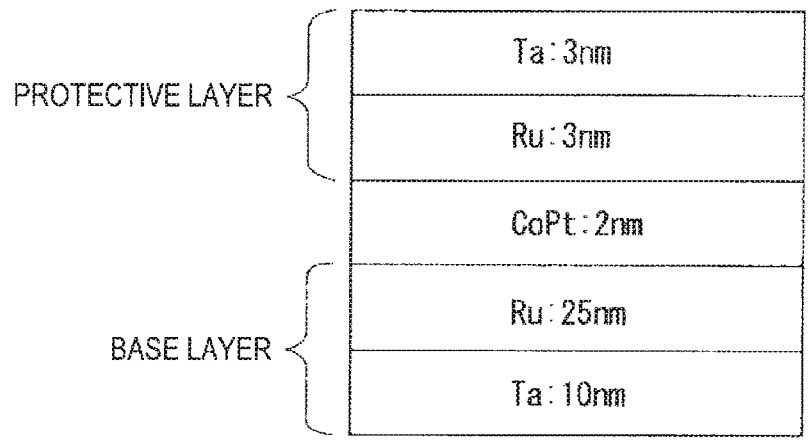
[Fig. 6]
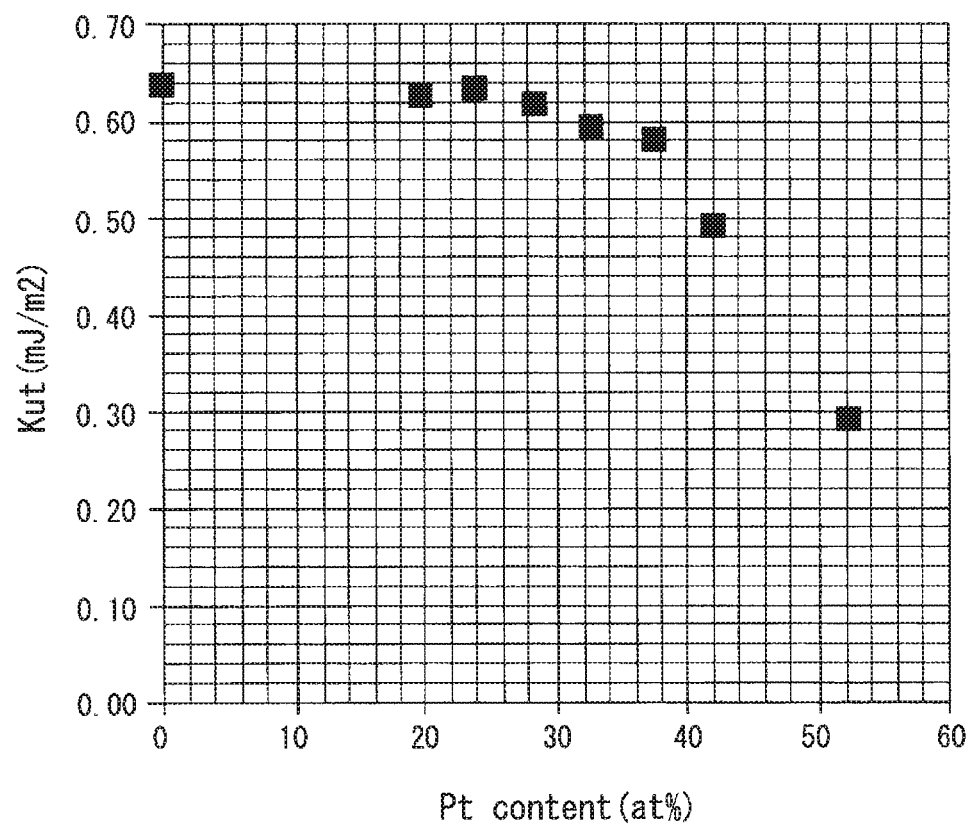

[Fig. 7]
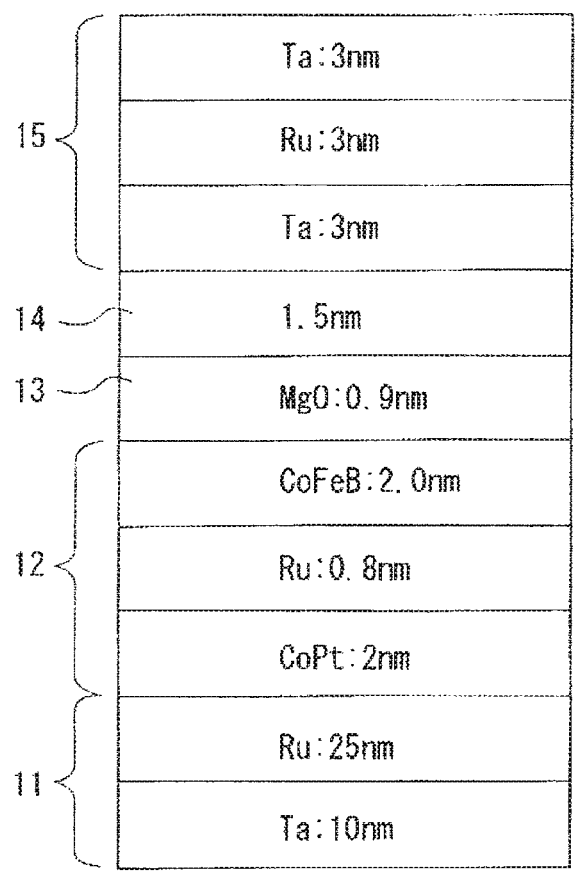

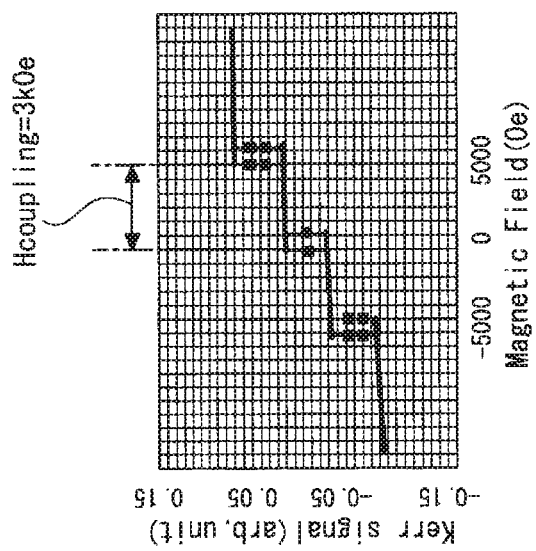
[Fig. 8B]
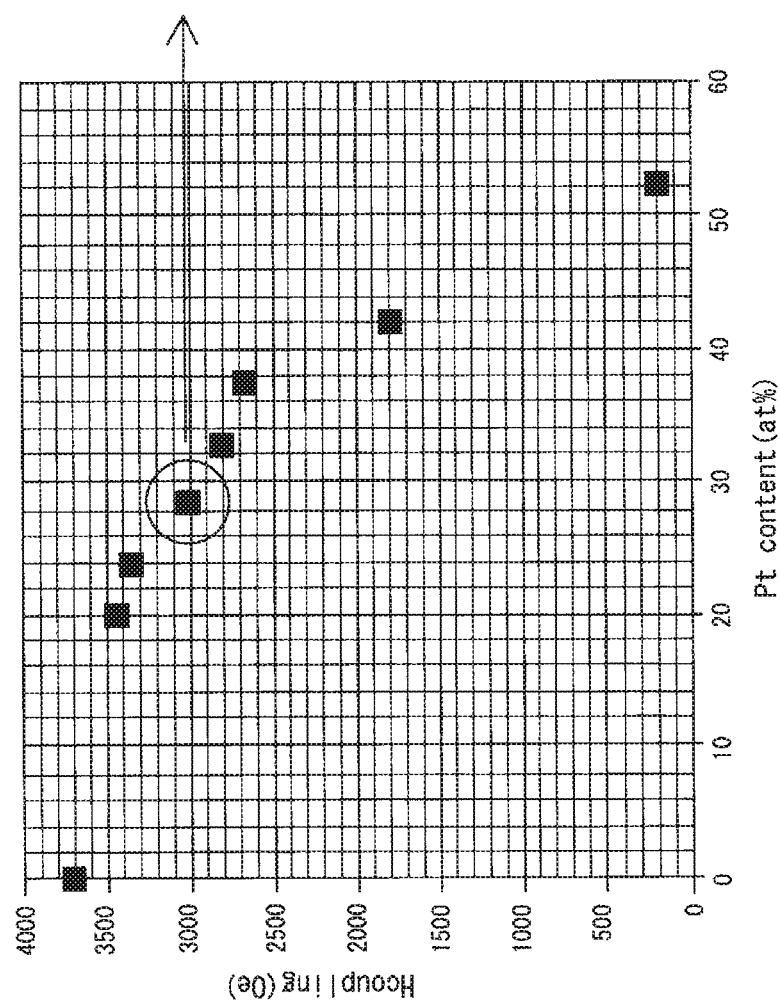
[Fig. 8A]

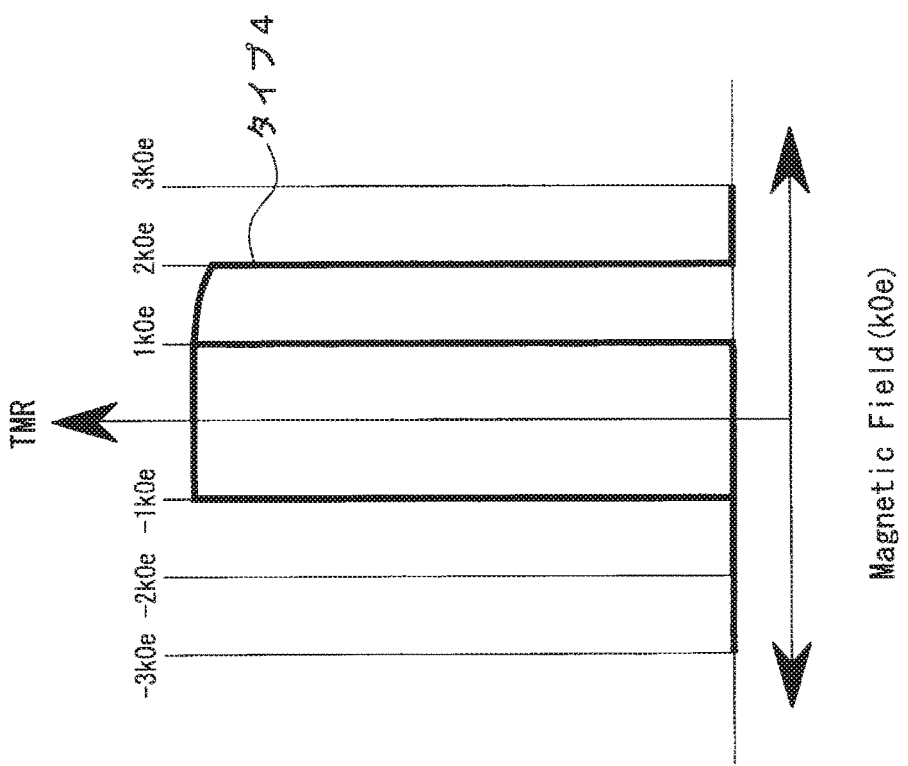
[Fig. 9A]
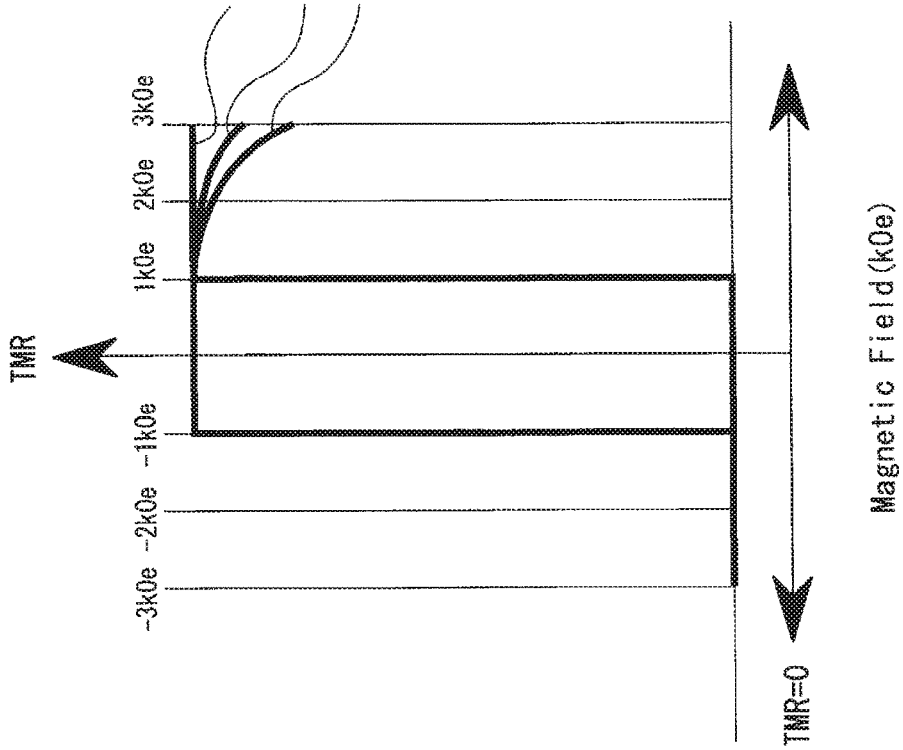
[Fig. 9B]

[Fig. 10]
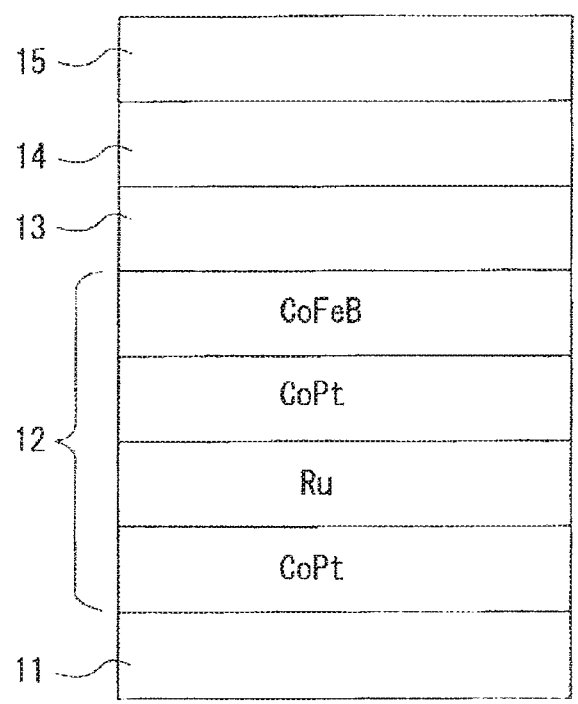

[Fig. 11]
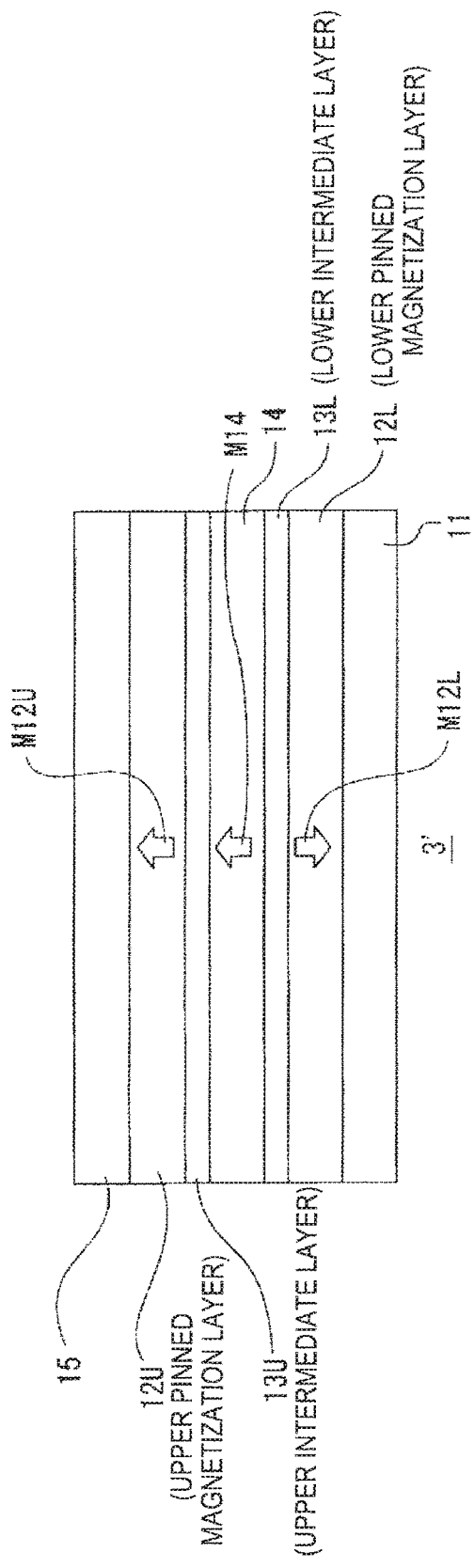

[Fig. 12A]
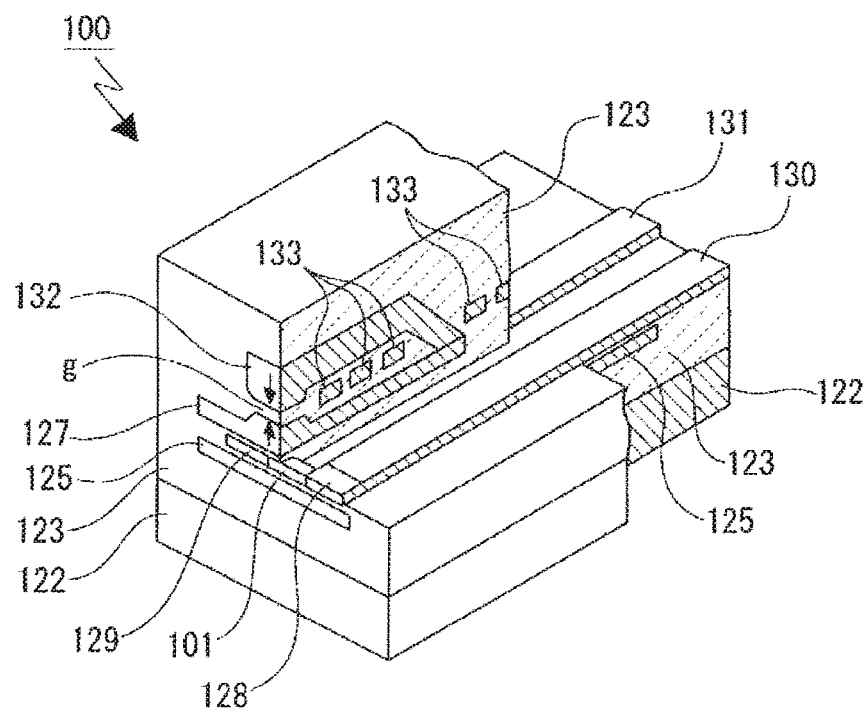
[Fig. 12B]
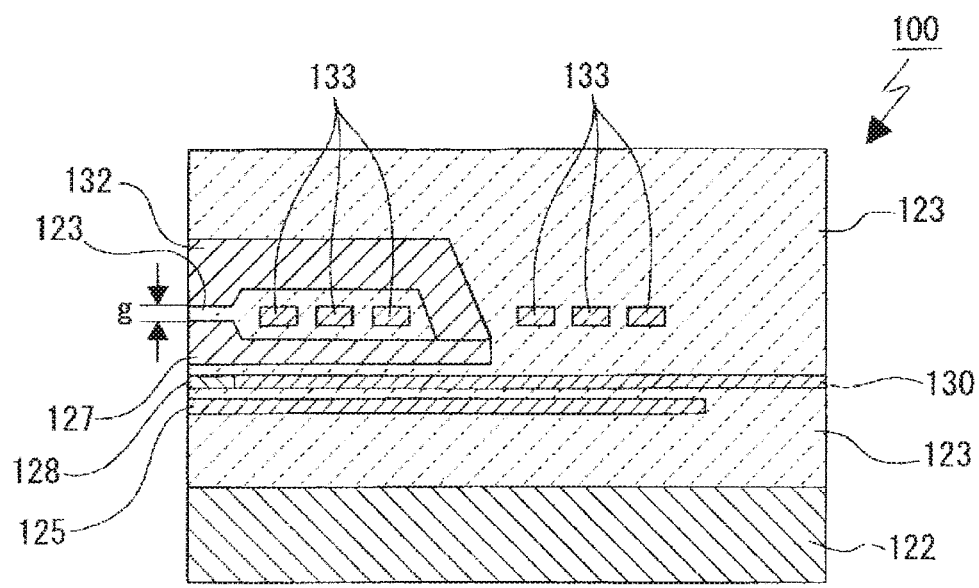

STORAGE ELEMENT

CROSS REFERENCES TO RELATED APPLICATIONS

The present application is a continuation of U.S. application Ser. No. 15/141,241, filed Apr. 28, 2016, which is a continuation of U.S. application Ser. No. 14/429,230, filed Mar. 18, 2015, issued as U.S. Pat. No. 9,343,657 on May 17, 2016, which is a national stage of International Application No. PCT/JP2013/004806 filed on Aug. 9, 2013 and claims priority to Japanese Patent Application No. 2012-217702 filed on Sep. 28, 2012, the disclosure of which is incorporated herein by reference.

BACKGROUND

The present disclosure relates to a storage element and a storage apparatus that include a plurality of magnetic layers and record data using spin torque magnetization reversal.

The present disclosure also relates to a magnetic head that detects a magnetic signal from a magnetic recording medium.

The present disclosure contains subject matter related to that disclosed in Japanese Priority Patent Application JP 2012-217702 filed in the Japan Patent Office on Sep. 28, 2012, the entire content of which is hereby incorporated by reference.

With the rapid development of various information appliances from mobile terminals to large-scale servers, even higher performance, such as higher integration, higher speed, and reduced power consumption, has been sought for components like memory and logic elements used to configure such appliances.

In particular, significant advances have been made in semiconductor non-volatile memory, with flash memory as a large-capacity file memory becoming increasingly widespread and taking the place of hard disk drives.

Meanwhile, the development of nonvolatile semiconductor memories is also advancing in order to replace NOR flash memory, DRAM, and the like that are presently typically used for code storage and for working memory. FeRAM (Ferroelectric Random Access Memory), MRAM (Magnetic Random Access Memory), and PCRAM (Phase Change RAM) can be given as examples of such nonvolatile semiconductor memories. Some of these have already been commercialized.

Out of such nonvolatile memories, MRAM stores data using the direction of magnetization of a magnetic body and is therefore capable of high-speed rewriting and almost infinite rewrites ($10^{15}$ times or more). MRAM is already in use in fields such as industrial automation and aircraft.

Due to its high-speed operation and reliability, there are high expectations on future use of MRAM as code storage and working memory.

However, reducing power consumption and increasing capacity remain as issues for MRAM. These are genuine problems due to the recording principles of MRAM, that is, an arrangement where magnetism is reversed using a current magnetic field generated from a wire.

As a method of solving the above problem, recording methods (that is, magnetic reversal) that do not rely on a current magnetic field are being investigated. Research relating to spin torque magnetization reversal is particularly active (see, for example, PTL 1, PTL 2, PTL 3, NPL 1, and NPL 2).

In the same way as MRAM, in many cases storage elements that use spin torque magnetization reversal are configured using MTJ (Magnetic Tunnel Junctions).

Such configuration uses the torque (also referred to as "spin transfer torque") applied to a free magnetic layer (whose direction of magnetization is not pinned) when spin-polarized electrons, which have passed a magnetic layer that is pinned in a certain direction, enter the free magnetic layer, with the free magnetic layer reversing when a current of a given threshold or larger flows. Rewriting of 0/1 is carried out by changing the polarity of the current.

The absolute magnitude of a current for such reversal is 1 mA or below for an element of a scale of around 0.1 micrometers. Since such current magnitude decreases in proportion to the element volume, scaling is also possible. In addition, since word lines for generating a recording current magnetic field that were necessary with MRAM are unnecessary, there is a further advantage that the cell construction becomes simplified.

Hereinafter, a MRAM that uses spin torque magnetization reversal is referred to as a STT-MRAM (Spin Torque Transfer-based Magnetic Random Access Memory). Note that spin torque magnetization reversal is sometimes also referred to as "spin injection magnetization reversal".

There are great expectations for STT-MRAM as a nonvolatile memory capable of reduced power consumption and increased capacity while maintaining the advantages of MRAM, i.e., high speed and the ability to perform almost infinite rewrites.

When an MTJ construction is applied to the construction of a storage element as an STT-MRAM, as one example a base layer, pinned magnetization layer, intermediate layer (insulating layer), storage layer, cap layer construction is used.

The merit of applying an MTJ construction is that a large rate of change in magnetoresistance can be ensured, which increases the read signal.

Here, since STT-MRAM is nonvolatile memory, it is necessary to stably store information written by a current. That is, it is necessary to ensure stability with respect to thermal fluctuations in magnetization of the storage layer (also referred to as "thermal stability").

If thermal stability of the storage layer is not ensured, there can be cases where the reversed direction of magnetization is re-reversed due to heat (i.e., the temperature in the operating environment), resulting in write errors.

As described above, compared to an existing MRAM, an STT-MRAM storage element is advantageous for scaling, or in other words, has an advantage in that it is possible to reduce the volume of the storage layer. However, when the volume is reduced, if other characteristics remain the same, there is a tendency for a drop in thermal stability.

Since the volume of a storage element becomes significantly smaller if the capacity of STT-MRAM increases, ensuring thermal stability is an important issue.

For this reason, thermal stability is an extremely important characteristic for a storage element in an STT-MRAM and it is necessary to use a design where thermal stability is ensured even when the volume is reduced.

Here, it is important to note that the current flowing in a storage element is limited to the magnitude of a current (that is, the saturation current of a selection transistor) capable of flowing in a selection transistor (i.e., a transistor for selecting a storage element in which a current is to flow out of the storage elements that construct each memory cell). In other words, it is necessary to carry out a write into a storage element using a current at or below the saturation current of a selection transistor.

Since it is known that the saturation current of a transistor falls as the transistor is miniaturized, to enable miniaturization of STT-MRAM, there is demand to improve the efficiency of spin transfer so as to reduce the current supplied to a storage element.

Also, if a tunnel insulating layer is used in an intermediate layer as an MTJ structure, to prevent dielectric breakdown of the tunnel insulating layer, there is a limit on the magnitude of current supplied to a storage element. In other words, from the viewpoint of maintaining reliability for repeated writes of a storage element also, it is necessary to suppress the current that is necessary for spin torque magnetization reversal.

In this way, in an STT-MRAM storage element, there is demand to reduce the reversal current necessary for spin torque magnetization reversal to the saturation current of a transistor and a current at which breakdown occurs for an insulation layer (intermediate layer) as a tunnel barrier, or lower.

That is, for an STT-MRAM storage element, there is demand to ensure thermal stability as described earlier and to also reduce the reversal current.

To achieve both a reduction in the reversal current and maintain thermal stability, attention has been focused on a construction that uses a perpendicular magnetization film as a storage layer.

It has been suggested, according to NPL3, for example, that using a perpendicular magnetization film such as a Co/Ni multilayer film in the storage layer makes it possible both to reduce the reversal current and to ensure thermal stability.

There are a number of types of magnetic material with perpendicular magnetic anisotropy, such as rare earth—transition metal alloys (such as TbCoFe), metal multilayer films (such as a Co/Pd multilayer film), ordered alloys (such as FePt), and use of interface anisotropy between an oxide and a magnetic metal (such as Co/MgO). However, in view of the use of a tunnel junction construction to realize a high rate of change in magnetoresistance that provides a large read signal in an STT-MRAM and also in view of heat resistance and ease of manufacturing, a material that uses interface anisotropy is desirable, that is, a construction where a magnetic material including Co or Fe is laminated on Mg as a tunnel barrier.

Meanwhile, it is also desirable to use a perpendicular magnetization magnetic material that has interface magnetic anisotropy in a pinned magnetization layer. In particular, to provide a large read signal, it is desirable to laminate a magnetic material including Co or Fe immediately below MgO as a tunnel barrier.

To ensure thermal stability, it is effective to use a so-called "laminated ferri-pinned construction" as the construction of the pinned magnetization layer. That is, the pinned magnetization layer is a laminated construction of at least three layers made up of at least two ferromagnetic layers and a non-magnetic layer. Normally, a laminated ferri-pinned construction will often use a laminated construction composed of two ferromagnetic layers and a non-magnetic layer (Ru).

By using a laminated ferri-pinned construction as the pinned magnetization layer, it is possible to reduce the bias on the storage layer due to a magnetic field which leaks from the pinned magnetization layer and thereby improve thermal stability.

SUMMARY

Technical Problem

Here, as described above, for an STT-MRAM storage element, it is important to improve thermal stability in order to reduce the element size (and in turn to increase memory capacity).

Ensuring thermal stability also contributes to stable operation of a storage apparatus.

It is desirable to further improve the thermal stability of an STT-MRAM storage element to enable further miniaturization of a storage element, to promote increases in storage capacity of a storage apparatus, and to stabilize the operation of a storage apparatus.

Solution to Problem

According to a first embodiment of the present technology, there is provided a storage element including a layered construction including a storage layer that has magnetization perpendicular to a surface of the storage layer and whose direction of magnetization is changed corresponding to information, a pinned magnetization layer that has magnetization perpendicular to a surface of the pinned magnetization layer and serves as a standard for information stored in the storage layer, and an insulating layer that is composed of a non-magnetic material and is provided between the storage layer and the pinned magnetization layer. Recording of information in the storage layer is carried out by changing the direction of magnetization of the storage layer by injecting spin-polarized electrons in a laminating direction of the layered construction, the pinned magnetization layer has a laminated ferri-pinned construction composed of at least two ferromagnetic layers and a non-magnetic layer, a magnetic material in the pinned magnetization layer that contacts the insulating layer is configured using a CoFeB magnetic layer, a magnetic material in the pinned magnetization layer that does not contact the insulating layer is one of an alloy and a laminated structure using at least one type of each of a Pt group metal element and a ferromagnetic 3d transition metal element that is a ferromagnetic element out of 3d transition metal elements, and an atomic concentration of the Pt group metal element is lower than an atomic concentration of the ferromagnetic 3d transition metal element.

The present disclosure improves thermal stability by improving the characteristics of a pinned magnetization layer using a laminated ferri-pinned construction.

Here, in an STT-MRAM (Spin Torque Transfer based Magnetic Random Access Memory), to improve thermal stability, the characteristic demanded for a pinned magnetization layer that uses a laminated ferri-pinned construction is that the laminated ferri coupling strength is high. As a result of thorough research by the present inventors, it was established that to improve the laminated ferri coupling strength of a pinned magnetization layer in a configuration where a perpendicular magnetic anisotropy material as a source of interface magnetic anisotropy is disposed below an insulating layer as a tunnel barrier, it is effective, in a magnetic material that constructs the pinned magnetization layer and is one of an alloy and a laminated structure using at least one type of each of a Pt group metal element and a ferromagnetic 3d transition metal element, to make the atomic concentration of the Pt group metal element lower than the ferromagnetic 3d transition metal element.

Accordingly, according to the embodiments of the present disclosure described above, it is possible to increase the laminated ferri coupling strength of the pinned magnetization layer and to improve thermal stability.

Advantageous Effects of Invention

According to the above embodiments of the present disclosure, it is possible to further improve the thermal stability of an STT-MRAM storage element, to further miniaturize a storage element, and to promote increases in storage capacity of a storage apparatus. Also, by improving thermal stability, it is possible to stabilize the operation of a storage apparatus.

According to a magnetic head according to an embodiment of the present disclosure that uses the same construction as a storage element according to an embodiment of the present disclosure, it is possible to realize a highly reliable magnetic head with superior thermal stability.

CITATION LIST

Patent Literature

PTL 1: JP 2003-17782A
PTL 2: U.S. Pat. No. 6,256,223
PTL 3: JP 2008-227388A

Non Patent Literature

NPL 1: Phys. Rev. B, 54, 9353(1996)
NPL 2: J. Magn. Mat., 159, L1(1996)
NPL 3: Nature Materials., 5, 210(2006)
NPL 4: Phys. Rev. Lett., 67, 3598(1991)

BRIEF DESCRIPTION OF THE FIGURES

FIG. 1 is a schematic perspective view of a storage apparatus according to an embodiment of the present disclosure.

FIG. 2 is a cross-sectional view of a storage apparatus according to the embodiment.

FIG. 3 is a plan view of a storage apparatus according to the embodiment.

FIG. 4 is a view (cross-sectional view) showing an overview of the configuration of a storage element according to the embodiment.

FIG. 5 is a view (cross-sectional view) showing the configuration of samples used in Experiment 1.

FIG. 6 is a diagram showing Kut (anisotropic energy) found from VSM measurement results for the various samples in Experiment 1.

FIG. 7 is a view (cross-sectional view) showing the configuration of storage element samples used in Experiment 2.

FIGS. 8A and 8B are diagrams useful in explaining H coupling found from Kerr measurement results for the various samples in Experiment 2.

FIGS. 9A and 9B are diagrams useful in explaining types of MR-H waveforms.

FIG. 10 is a view (cross-sectional view) showing the configuration of storage element samples used in Experiment 3.

FIG. 11 is a view (cross-sectional view) showing the configuration of a storage element as a modification.

FIGS. 12A and 12B are views showing an example application of the storage element (magnetoresistance effect element) according to the present embodiment to a composite magnetic head.

DETAILED DESCRIPTION

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Embodiments of the present disclosure are described in the order indicated below.

1. Overall Configuration of Storage Apparatus According to an Embodiment
2. Overview of Storage Element According to the Embodiment
3. Specific Examples and Experimental Results
4. Modifications 1. Overall Configuration of Storage Apparatus According to an Embodiment First, the overall configuration of a storage apparatus will be described. Schematic diagrams of the storage apparatus are shown in FIGS. 1 to 3. FIG. 1 is a perspective view, FIG. 2 is a cross-sectional view, and FIG. 3 is a plan view.

As shown in FIG. 1, the storage apparatus according to the present embodiment has storage elements 3 that use STT-MRAM (Spin Transfer Torque-based Magnetic Random Access Memory) capable of holding information in a magnetization state disposed in the vicinity of intersections of two types of address wires (for example, word lines and bit lines) that are perpendicular to each other.

That is, a drain region 8, a source region 7, and a gate electrode 1, which construct a selection transistor for selecting a storage element 3, are formed at parts of a semiconductor substrate 10, such as a silicon substrate, that are separated by an element separating layer 2. Out of such parts, each gate electrode 1 also serves as one address wire (word line) that extends in the front-rear direction in the drawing.

Each drain region 8 is formed so as to be shared by the right and left selection transistors in FIG. 1, with a wire 9 being connected to such drain region 8.

The storage element 3 that has a storage layer whose direction of magnetization is reversed according to spin torque magnetization reversal is disposed between the source region 7 and a bit line 6 that is disposed above the storage element 3 and extends in the left-right direction in FIG. 1. The storage element 3 is configured for example using a magnetic tunnel junction element (MTJ element).

As shown in FIG. 2, the storage element 3 has two magnetic layers 12, 14. Out of the two magnetic layers 12, 14, one magnetic layer is set as a pinned magnetization layer 12 whose direction of magnetization M12 is pinned and the other magnetic layer is set as a free magnetism layer, that is, a storage layer 14, whose direction of magnetization M14 is variable.

The storage element 3 is also connected to the bit line 6 and the source region 7 respectively via upper and lower connect layers 4.

By doing so, a current is supplied via the two types of address wires 1 and 6 and caused to flow in the storage element 3 in the up-down direction (the laminating direction), which makes it possible to reverse the direction of the magnetization M14 of the storage layer 14 according to spin torque magnetization reversal.

As shown in FIG. 3, the storage apparatus is configured by disposing a storage element 3 at each intersection of a large number of first wires (word lines) and second wires (bit lines) that are perpendicularly laid out in a matrix.

The storage elements 3 are circular in shape when viewed from above and have the cross-sectional construction shown in FIG. 2.

As shown in FIG. 2, each storage element 3 includes the pinned magnetization layer 12 and the storage layer 14.

Each storage element 3 constructs a memory cell of the storage apparatus.

With this storage apparatus, it is necessary to perform writes with a current that is equal to or below the saturation current of the selection transistor. Since it is known that the saturation current of a transistor decreases together with miniaturization, in order to miniaturize the storage apparatus, it would be preferable to increase the efficiency of the spin transfer and reduce the current flowing in the storage elements 3.

It is also necessary to ensure a high rate of change in magnetoresistance to increase the read signal. To do so, it is effective to use the MTJ construction described earlier, that is, to use a storage element 3 configuration where an intermediate layer between the two magnetic layers 12, 14 is a tunnel insulating layer (tunnel barrier layer).

If a tunnel insulating layer is used in this way as an intermediate layer, a limit is imposed on the magnitude of current flowing in the storage element 3 to prevent dielectric breakdown of the tunnel insulating layer. That is, also from the viewpoint of ensuring reliability for repeated writes of the storage element 3, it is preferable to suppress the current necessary for spin torque magnetization reversal. Note that the current necessary for spin torque magnetization reversal is also referred to as the "reversal current", the "storage current", and the like.

Also, since the storage apparatus according to the present embodiment is a nonvolatile memory, it is necessary to stably store information that has been written using a current. That is, it is necessary to ensure stability (thermal stability) against thermal fluctuations in the magnetization of the storage layer 14.

If thermal stability of the storage layer 14 is not ensured, there can be cases where the reversed direction of magnetization is re-reversed due to heat (the temperature in the operating environment), resulting in storage errors.

Compared to an existing MRAM, the storage element 3 (STT-MRAM) of the present storage apparatus is advantageous for scaling, that is, it is possible to reduce the volume. When volume is reduced, if other characteristics remain the same, there is a tendency for a drop in thermal stability.

Since the volume of each storage element 3 becomes significantly smaller as the capacity of STT-MRAM is raised, ensuring thermal stability is an important issue.

For this reason, thermal stability is an extremely important characteristic for the storage elements 3 in an STT-MRAM, and it is necessary to use a design where thermal stability is ensured even when volume is reduced.

2. Overview of Storage Element According to the Embodiment

Next, an overview of the configuration of the storage element 3 according to the present embodiment will be described with reference to FIG. 4.

As shown in FIG. 4, the storage element 3 has the pinned magnetization layer (also referred to as the "reference layer") 12 whose direction of magnetization M12 is pinned, the intermediate layer (non-magnetic layer: tunnel insulating layer) 13, the storage layer (free magnetization layer) 14 whose direction of magnetization M14 is variable, and a gap layer 15 laminated in that order on a base layer 11.

The storage layer 14 has magnetization M14 that is perpendicular to the film surface and whose direction of magnetization changes corresponding to information.

The pinned magnetization layer 12 has magnetization M12 that is perpendicular to the film layer and serves as a standard for information stored on the storage layer 14. The direction of magnetization M12 of the pinned magnetization layer 12 is pinned by high coercivity or the like.

The intermediate layer 13 is a non-magnetic material and is provided between the storage layer 14 and the pinned magnetization layer 12.

By injecting electrons that are spin polarized in the laminating direction of the layered construction including the storage layer 14, the intermediate layer 13, and the pinned magnetization layer 12, the direction of magnetization of the storage layer 14 is changed, thereby recording information in the storage layer 14.

Next, spin torque magnetization reversal will be described in brief.

Electrons have two types of spin angular momentum. Assume that such types are defined here as "upward" and "downward". In a non-magnetic material, both types are equal in number, while inside a ferromagnetic material, there is a difference in the number of the two types. Consider a case where electrons are caused to move from the pinned magnetization layer 12 to the storage layer 14 in a state where the respective magnetic moments in the pinned magnetization layer 12 and the storage layer 14 that are two layers of ferromagnetic material that construct an STT-MRAM are in opposite directions (i.e., are antiparallel).

The pinned magnetization layer 12 is a pinned magnetic layer where the direction of the magnetic moment is pinned due to high coercivity.

Electrons that pass through the pinned magnetization layer 12 are spin-polarized, that is, a difference is produced between the respective numbers of upward and downward types. If the thickness of the intermediate layer 13 that is a non-magnetic layer is made sufficiently thin, the electrons will reach the other magnetic material, that is, the storage layer 14, before the spin polarization due to passing through the pinned magnetization layer 12 is moderated and the unpolarized state (where the numbers of upward and downward types are equal) in a normal non-magnetic material is reached.

Since the sign of spin polarization is opposite in the storage layer 14, to reduce the system energy, some of the electrons are reversed, that is, the direction of spin angular momentum is changed. At this time, since it is necessary for the total angular momentum of the system to be preserved, a reaction equivalent to the total of the change in angular momentum caused by the electrons whose direction has changed is also applied to the magnetic moment of the storage layer 14.

If the current, that is, the number of electrons that pass through per unit time, is low, since the total number of electrons whose direction changes is also low, the change in angular momentum produced in the magnetic moments of the storage layer 14 will also be small. However, if the current increases, it is possible to apply a large change in angular momentum per unit time.

The time variation in angular momentum is torque, and if the torque exceeds a given threshold, precession of the magnetic moment of the storage layer 14 starts and, due to the uniaxial anisotropy, the magnetic moment becomes stable at a position rotated by 180 degrees. That is, a reversal occurs from the opposite direction (antiparallel) to the same direction (parallel).

When the magnetization is in the same direction, if a current flows in the opposite direction so as to send electrons from the storage layer 14 to the pinned magnetization layer 12, this time electrons that were spin reversed on being reflected by the pinned magnetization layer 12 will provide torque on entering the storage layer 14, making it possible to reverse the magnetic moment to the opposite direction. However, when doing so, the magnitude of the current necessary to cause reversal is larger than when reversing from the opposite direction to the same direction.

Although it is difficult to intuitively understand reversal of a magnetic moment from the same direction to the opposite direction, consider that the magnetic moment of the pinned magnetization layer 12 is not reversed due to the pinned magnetization layer 12 being pinned, and therefore the storage layer 14 is reversed to preserve the angular momentum of the entire system.

In this way, the recording of 0/1 is carried out by causing a current that corresponds to the respective polarities and has a magnitude equal to a threshold or higher to flow in a direction from the pinned magnetization layer 12 to the storage layer 14 or in the opposite direction.

Meanwhile, the reading of information is carried out using a magnetoresistance effect in the same way as with existing MRAM. That is, in the same way as recording described above, a current is caused to flow in the direction perpendicular to the film surfaces. A phenomenon whereby the magnetoresistance exhibited by the element changes according to whether the magnetic moment of the storage layer 14 is in the same direction as, or the opposite direction to, the magnetic moment of the pinned magnetization layer 12 is used.

The material used as the intermediate layer 13 between the pinned magnetization layer 12 and the storage layer 14 may be a metal or may be an insulator. However, there are cases where an insulator is used as the intermediate layer to obtain a higher read signal (or rate of change of resistance) and to enable recording with a smaller current. Such an element is referred to as a magnetic tunnel junction (MTJ).

However, when the direction of magnetization of a magnetic layer is reversed by spin torque magnetization reversal, a threshold Ic of the necessary current differs according to whether the axis of easy magnetization of the magnetic layer is the in-plane direction or the perpendicular direction.

If the reversal current of an in-plane magnetization type STT-MRAM is expressed as "Ic_para", parallel->antiparallel: Ic-para=(A×alpha×Ms×V/g(0)/P)(Hk+2piMs)

antiparallel->parallel: Ic_para=-(A×alpha×Ms×V/g(pi)/P)(Hk+2piMs)

Meanwhile, if the reversal current of a perpendicular magnetization type STT-MRAM is expressed as "Ic_perp", parallel->antiparallel: Ic_perp=(A×alpha×Ms×V/g(0)/P)(Hk−4piMs)

antiparallel->parallel: Ic_perp=(A×alpha×Ms×V/g(pi)/P)(Hk−4piMs)

where A is a constant, alpha is a damping constant, Ms is saturation magnetization, V is element volume, g(0)P, g(pi)P are coefficients corresponding to the efficiency with which spin torque is transmitted to the other magnetic layer when the magnetism is parallel or antiparallel, and Hk is magnetic anisotropy (see NPL 3).

In the above equations, by comparing (Hk−4piMs) for a perpendicular magnetization type and (Hk+2piMs) for an in-plane magnetization type, it can be understood that the perpendicular magnetization type is suited to reduction of the recording current.

Note that when expressed using the relationship with delta that is the index of thermal stability, described later, the reversal current Ic is expressed by Equation 1 below.

[Math. 1]

$$Ic = \left(\frac{4ek_BT}{\hbar}\right)\left(\frac{\alpha\Delta}{\eta}\right) \quad \text{(Equation 1)}$$

where e is the charge of an electron, eta is the spin injection efficiency, h with a bar is the conversion Planck's constant, alpha is the damping constant, $k_B$ is the Boltzmann's constant, and T is temperature.

Here, to enable use as a memory, it is necessary to hold information written in the storage layer 14. The ability to hold information is determined from the value of the index delta (=KV/$k_B$T) of thermal stability. Delta is expressed by Equation 2 below.

[Math. 2]

$$\Delta = \frac{KV}{k_BT} = \frac{MsVHk}{2k_BT} \quad \text{(Equation 2)}$$

Here, K is the anisotropic energy, Hk is the effective anisotropic magnetic field, $k_B$ is the Boltzmann's constant, T is temperature, Ms is the saturation magnetization, and V is the volume of the storage layer.

The effective anisotropic magnetic field Hk is affected by magnetic shape anisotropy, induced magnetic anisotropy, crystal magnetic anisotropy, and the like, and if a coherent rotation model with a single domain is assumed, is equal to the coercivity.

In many cases the index delta of thermal stability delta and the current threshold Ic are in a trade-off relationship. This means that to maintain the memory characteristics, favorably setting both values is often problematic.

In reality, for a circular TMR element where the thickness of the storage layer 14 is around 2 nm and a flat pattern has a diameter of around 100 nm for example, the threshold for the current that changes the magnetization of the storage layer 14 is around one hundred to several hundred micro amps.

Conversely, in a normal MRAM where magnetization is reversed by a current magnetic field, a write current of several milliamps or larger is necessary.

Accordingly, since the threshold of the write current is sufficiently small as described above for an STT-MRAM, this is also effective in reducing the power consumption of an integrated circuit.

Also, since wiring for generating a current magnetic field that was necessary with a normal MRAM is unnecessary, this is also advantageous in terms of integration density compared to a normal MRAM.

Here, if spin torque magnetization reversal is carried out, since a current is directly applied to the storage element 3 to carry out a write (recording) of information, a memory cell is configured by connecting the storage element 3 to a selection transistor so as to select memory cells where a write is to be carried out.

In this case, the current flowing in the storage element 3 is limited by the magnitude of the current capable of flowing in the selection transistor (that is, the saturation current of the selection transistor).

It is desirable to use perpendicular magnetization as described above to reduce the recording current. Since a perpendicular magnetization film is normally also capable of having higher magnetic anisotropy than an in-plane magnetization film, this is also preferable in maintaining a high value for delta described above.

Although there are various types of magnetic material with perpendicular anisotropy, such as rare earth-transition metal alloys (like TbCoFe), metal multilayer films (like a Co/Pd multilayer film), ordered alloys (like FePt), and use of interface anisotropy between an oxide and the magnetic metal (like Co/MgO), since rare earth-transition metal alloys lose their perpendicular magnetic anisotropy on diffusing and crystallizing due to heat, such alloys are not preferable as an STT-MRAM material. It is also known that metal multilayer films diffuse due to heat, causing deterioration in the perpendicular magnetic anisotropy, and since such perpendicular magnetic anisotropy is expressed by a face-centered cubic (111) orientation, it is difficult to realize the (001) orientation required for MgO and/or a high polarization layer of Fe, CoFe, CoFeB or the like disposed adjacent to the MgO. An L10 ordered alloy is stable at high temperature and exhibits perpendicular magnetic anisotropy with a (001) orientation, which means that the above problem does not occur, but it is necessary to order the atoms either by heating to a sufficiently high temperature of 500 degrees Celsius or above during manufacturing or by carrying out a heat treatment at a high temperature of 500 degrees Celsius or above after manufacturing, which has the risk of causing undesired diffusion in other parts of the laminated film, such as the tunnel barrier, and increasing interface roughness.

Conversely, a material that uses interface magnetic anisotropy, that is, a material where a Co type or Fe type material is laminated on MgO that is a tunnel barrier is not susceptible to any of the above problems and for that reason is promising as a storage layer material of an STT-MRAM.

Meanwhile, it is desirable to use a perpendicular magnetization magnetic material with interface magnetic anisotropy in the pinned magnetization layer 12. In particular, to provide a large read signal, a material where a magnetic material including Co or Fe is laminated below MgO that is a tunnel barrier is desirable.

In the present embodiment, the storage layer 14 is a CoFeB perpendicular magnetization film.

In addition, in consideration to the saturation current value of the selection transistor, the intermediate layer 13 between the storage layer 14 and the pinned magnetization layer 12 is configured as a magnetic tunnel junction (MTJ) element using a tunnel insulating layer made up of an insulator.

By configuring a magnetic tunnel junction (MTJ) element using a tunnel insulating layer, compared to a case where a giant magnetoresistance effect (GMR) element is configured using a non-magnetic conductive layer, it is possible to increase the rate of change in magnetoresistance (MR ratio) and possible to increase the read signal strength.

In particular, by using magnesium oxide (MgO) as the material of the intermediate layer 13 as the tunnel insulating layer, it is possible to increase the rate of change in magnetoresistance (MR ratio).

The efficiency of spin transfer normally depends on the MR ratio, and the higher the MR ratio, the higher the efficiency of spin transfer, making it possible to reduce the magnetization reversal current density.

Accordingly, by using the storage layer 14 described above at the same time as using magnesium oxide as the material of the tunnel insulating layer, it is possible to reduce a write threshold current that uses spin torque magnetization reversal, and therefore possible to carry out a write (recording) of information with a small current. It is also possible to increase the read signal strength.

By doing so, it is possible to maintain the MR ratio (TMR ratio) and to reduce the write threshold current that uses spin torque magnetization reversal, which makes it possible to carry out a write (recording) of information with a small current. It is also possible to increase the read signal strength.

If the tunnel insulating layer is formed by a magnesium oxide (MgO) film in this way, it is more desirable to crystallize the MgO and to keep the crystal orientation in the (001) direction.

Note that in the present embodiment, aside from a configuration where the intermediate layer 13 between the storage layer 14 and the pinned magnetization layer 12 is made from magnesium oxide as described earlier, it is also possible to use a configuration using various insulators, dielectrics, and semiconductors such as aluminum oxide, aluminum nitride, $SiO_2$, $Bi_2O_3$, $MgF_2$, CaF, $SrTiO_2$, $AlLaO_3$, and Al—N—O.

From the viewpoint of obtaining the current density necessary to reverse the direction of magnetization of the storage layer 14 using spin torque magnetization reversal, it is desirable to control the areal resistance of the tunnel insulating layer to around several tens of ohm-square micrometers or less.

Also, to set the areal resistance of a tunnel insulating layer made of an MgO film in the range indicated above, it is desirable to set the thickness of the MgO film at 1.5 nm or below.

In the storage element 3 according to the present embodiment, the cap layer 15 is disposed adjacent to the storage layer 14.

Here, in the storage element 3, although it would be conceivable to use a single layer construction as the construction of the pinned magnetization layer 12, it is effective to use a laminated ferri-pinned construction composed of two or more ferromagnetic layers and a non-magnetic layer. By using a laminated ferri-pinned construction as the pinned magnetization layer 12, it is possible to easily cancel out asymmetry in thermal stability with respect to the information write direction, and to improve stability with respect to spin torque.

For this reason, in the present embodiment, it is assumed that the pinned magnetization layer 12 is a laminated ferri-pinned construction. That is, the laminated ferri-pinned construction is made up of at least two ferromagnetic layers and a non-magnetic layer.

To improve thermal stability, the characteristic necessary for the pinned magnetization layer 12 is that the laminated ferri coupling strength is high when the magnetic layers used in the configuration are the same.

As a result of extensive research by the present inventors, it was established that to increase the laminated ferri coupling strength of the pinned magnetization layer 12 in a configuration where a perpendicular magnetic anisotropy material that serves as the source of interface magnetic anisotropy is disposed below a tunnel barrier insulating layer, it is important to increase the magnetic anisotropy energy of the at least two magnetic films that construct the pinned magnetization layer 12, and in particular to use, in a magnetic layer that does not contact the tunnel barrier insulating layer, an alloy or a laminated construction that uses at least one type of a Pt group metal element with large anisotropic energy and a ferromagnetic 3d transition metal element as a ferromagnetic element out of 3d transition metal elements. At such time, it was discovered that by setting the atomic concentration of the Pt group metal element lower than the ferromagnetic 3d transition metal element, the laminated ferri coupling strength is increased.

For the above reason, in the storage element 3 according to the present embodiment, the pinned magnetization layer 12 is configured as described below.

That is, it is assumed that the pinned magnetization layer 12 according to the present embodiment has a laminated ferri-pinned construction made up of at least two ferromagnetic layers and a non-magnetic layer, the magnetic material that contacts the recording layer in the pinned magnetization layer is composed of a CoFeB magnetic layer, the magnetic material that does not contact the insulating layer in the pinned magnetization layer is composed of an alloy or a laminated structure using at least one type of each of a Pt group metal element and a ferromagnetic 3d transition metal element that is a ferromagnetic element out of 3d transition metal elements, and the atomic concentration of the Pt group metal element is lower than the ferromagnetic 3d transition metal element.

By using this configuration, it is possible to increase the ferromagnetic coupling strength of the pinned magnetization layer 12 and to further improve thermal stability (i.e., the ability to hold information). By improving the terminal stability, it is possible to further miniaturize the storage element 3 and to promote increased storage capacity of a storage apparatus.

Also, by improving the thermal stability, it is possible to suppress operation errors and to obtain a sufficient operating margin for the storage element 3, thereby making it possible for the storage element 3 to operate stably.

Accordingly, it is possible to realize a storage apparatus that operates stably and has high reliability.

With the storage element 3 according to the present embodiment, since the storage layer 14 is a perpendicular magnetization film, it is possible to reduce the write current that is necessary to reverse the direction of magnetization M14 of the storage layer 14.

By reducing the write current in this way, it is possible to reduce power consumption when carrying out a write in the storage element 3.

Here, as shown in FIG. 4, it is possible to manufacture the storage elements 3 according to the present embodiment by first consecutively forming the base layer 11 to the metal cap layer 15 inside a vacuum device and then forming a pattern of the storage elements 3 by machining, such as etching.

Accordingly, when manufacturing the storage apparatus, there is the advantage that it is possible to use a typical semiconductor MOS formation process. That is, the storage apparatus according to the present embodiment can be used as general-purpose memory.

Note that in the storage element 3 according to the present embodiment, it is also possible to add non-magnetic elements to the storage layer 14.

By adding different types of elements, effects such as improved heat resistance by preventing diffusion, an increased magnetoresistance effect, and an improvement in dielectric breakdown voltage that accompanies smoothing are obtained. As the material of the added elements, it is possible to use B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os, or alloys and oxides of the same.

As the storage layer 14, it is also possible to directly laminate another ferromagnetic layer of a different composition. Alternatively, it is also possible to laminate a ferromagnetic layer and a soft magnetic layer or to laminate a plurality of ferromagnetic layers with soft magnetic layers or non-magnetic layers in between. The effects of the present disclosure are still achieved even when laminating is carried out in this way.

In particular, when a configuration is used where a plurality of ferromagnetic layers are laminated with non-magnetic layers in between, since it is possible to adjust the intensity of the interactions between the ferromagnetic layers, an effect is obtained whereby it is possible to suppress the magnetization reversal current from becoming large. In such case, it is possible to use Ru, Os, Re, Jr, Au, Ag, Cu, Al, Bi, Si, B, C, Cr, Ta, Pd, Pt, Zr, Hf, W, Mo, and Nb or an alloy of the same as the material of the non-magnetic layer(s).

It is desirable for the respective thicknesses of the pinned magnetization layer 12 and the storage layer 14 to be in a range of 0.5 nm to 30 nm.

It is desirable for the dimensions of the storage element 3 to be reduced so as to enable easy reversal of the direction of magnetization of the storage layer 14 with a small current.

As one example, it is desirable for the area of the storage element 3 to be 0.01 square micrometers or below.

As the remaining configuration of the storage element 3, it is possible to use the known configuration of an existing storage element that records information according to spin torque magnetization reversal.

As one example, it is possible to use Co, CoFe, CoFeB, or the like as the material of the ferromagnetic layer constructing the pinned magnetization layer 12 of the laminated ferri-pinned construction. Also, as the material of the non-magnetic layer, it is possible to use Ru, Re, Ir, Os, or the like.

Magnetic materials such as FeMn alloy, PtMn alloy, PtCrMn alloy, NiMn alloy, IrMn alloy, NiO, and $Fe_2O_3$ can be given as examples of the material of an antiferromagnetic layer.

It is also possible to add a non-magnetic element such as Ag, Cu, Au, Al, Si, Bi, Ta, B, C, O, N, Pd, Pt, Zr, Ta, Hf, Jr, W, Mo, and Nb to such magnetic materials to adjust the magnetic characteristics and/or to adjust various other properties such as crystalline structure, crystallinity, and stability as a substance.

The film configuration (layer construction) of the storage element 3 may be any configuration where the storage layer 14 is disposed below the pinned magnetization layer 12.

3. Specific Examples and Experimental Results

Experiment 1

Here, samples were fabricated for the storage element 3 according to the present embodiment and the magnetic characteristics were investigated.

Note that although as shown in FIG. 1, an actual storage apparatus includes semiconductor circuits for switching and the like in addition to the storage elements 3, investigations were carried out here using a wafer on which only a CoPt perpendicular magnetization film was formed to investigate the magnetic characteristics of the perpendicular magnetization film of the pinned magnetization layer 12.

For such samples, a thermally-oxidized film with a thickness of 300 nm was formed on a silicon substrate with a thickness of 0.725 mm and the laminated structure shown in FIG. 5 was then formed on top.

More specifically
base layer 11: laminated film composed of 10 nm-thick film of Ta and 25 nm-thick film of Ru
perpendicular magnetization film in pinned magnetization layer 12: 2 nm-thick CoPt film Note that in this experiment, as shown in the drawings, a laminated film of 3 nm of Ru and 3 nm of Ta was formed as a protective layer on the perpendicular magnetization film in the pinned magnetization layer 12.

Also, in this experiment, the composition of the CoPt film was varied in a range where Pt=0 to 52 atomic %. Note that the expression Pt=0 atomic % refers to a laminated structure of Pt:5 nm/Co:2 nm. When Pt:5 nm/Co:2 nm is used in this way, since Co and Pt are not mixed, Pt is treated as a base, resulting in Pt=0 atomic %.

After all of the films described above have been deposited, the samples of this experiment were subjected to heat treatment at 350 degrees Celsius.

In this experiment, the magnetic characteristics were measured using a vibrating sample magnetometer (VSM).

For the various samples produced by varying the CoPt composition as described above, the Kut (anisotropic energy multiplied by CoPt laminated thickness) calculated from the VSM measurement results is shown in FIG. 6. Here, Kut was found by measuring an externally applied magnetic field (Hk) necessary to saturate magnetization in an in-plane direction for the film surface of the sample and the saturation magnetization Ms in a direction perpendicular to the film surface.

As shown in FIG. 6, Kut in a range where the Pt atomic % is 0 to 38% is substantially constant at 0.6 erg/cc or has a tendency to slightly fall, but when the Pt atomic % exceeds 40%, a comparatively large fall in Kut of around 0.1 erg/cc is observed. From such results, it is possible to confirm that a large change in the Kut of CoPt occurs when the Pt atomic % is close to 40%. It was also established that the Kut of a sample where the Pt atomic % exceeds 50% is 0.3 erg/cc or below, which is a large drop to half or less of a sample where the Pt atomic % is 0 to 38%.

From such results, it is possible to state that it is desirable for the atomic concentration of the Pt group metal element that constructs the perpendicular magnetization film to be 40% or below to achieve stability and a sufficient laminated ferri coupling strength for the pinned magnetization layer.

Experiment 2

Next, samples were fabricated and characteristics were investigated for the entire structure of the storage element 3 according to the present embodiment.

In Experiment 2, investigations were carried out here using a wafer on which only the storage elements 3 were formed to investigate the magnetization reversal characteristics of the pinned magnetization layer 12.

More specifically, a thermally-oxidized film with a thickness of 300 nm was formed on a silicon substrate with a thickness of 0.725 mm and the storage element 3 was then formed on top using the construction shown in FIG. 7.

As shown in FIG. 7, the materials and thicknesses of the respective layers that construct the pinned magnetization layer 12 were selected as indicated below.

Pinned magnetization layer 12: laminated film of CoPt:2 nm/Ru:0.8 nm/CoFeB:2 nm

Also, in this experiment, the composition of the CoPt was varied in a range where Pt=0 to 52 atomic %. Note that the expression Pt=0 atomic % in this case also refers to a laminated structure of Pt:5 nm/Co:2 nm.

The materials and thicknesses of the respective layers aside from the pinned magnetization layer 12 were selected as indicated below.
base layer 11: laminated film of 10 nm-thick film of Ta and 25 nm-thick film of Ru
intermediate layer (tunnel insulating layer) 13: 0.9 nm-thick magnesium oxide film
storage layer 14: CoFeB: 1.5 nm
cap film 15: laminated film of Ta:3 nm/Ru:3 nm/Ta:3 nm After all of the films described above have been deposited, the samples of this experiment were subjected to heat treatment at 350 degrees.

The composition of the CoFeB alloy of the pinned magnetization layer 12 and the storage layer 14 was set at CoFe80% (Co30%-Fe70%)–B20% (all atomic %).

The intermediate layer 13 composed of a magnesium oxide (MgO) film was deposited using RF magnetron sputtering and the other films were deposited using a DC magnetron sputtering.

In this experiment, the magneto-optic Kerr effect was used to measure the magnetic characteristics.

Hcoupling found from the results of measuring the Kerr effect will now be described with reference to FIG. 8 for respective samples produced by varying the CoPt composition as described above.

In FIG. 8, FIG. 8A expresses Hcoupling for the respective samples. Here, as illustrated in FIG. 8B, Hcoupling is defined at a magnetic field (3 kOe) where the laminated ferri-coupling is broken.

As shown in FIG. 8A, Hcoupling exhibits the same tendency regarding the dependence on Pt atomic % as Kut shown in FIG. 6, with there being a change point in the magnitude of Hcoupling when Pt atomic % is close to 40%. In more detail, although a certain level of Hcoupling is maintained until the Pt atomic % is 42%, Hcoupling is substantially lost for samples where Pt atomic % is 52%. Accordingly, from the results of this experiment, it can be said that to obtain a certain level of Hcoupling, it is necessary for the Pt atomic % to be at least lower than the atomic % of Co and more desirably if the Pt atomic % is lower than 40%, it is possible to realize a large Hcoupling, that is, a more stable laminated ferri coupling strength.

In reality, when an element with a diameter of 50 nm phi is processed and the electrical characteristics were investigated, although a change in resistance of 10% or more was obtained when the areal resistance is in a vicinity of 10 ohm-square micrometers for samples with any CoPt composition, for samples with a Pt atomic % of 52%, the MR curve expected for a laminated ferri-type MTJ was not obtained and instead the results were close to the MR curve expected for a coercivity difference-type MTJ.

Also, in this experiment, as shown in Table 1 below, for six samples where the Pt atomic % in a storage element 3 with the construction shown in FIG. 7 was respectively set at 0% (Specific Example 1), 19.5% (Specific Example 2), 28% (Specific Example 3), 32.5% (Specific Example 4), 37% (Specific Example 5), and 42% (Comparative Example 1), the MR-H waveform type, the drop in TMR when a 2.0 kOe external magnetic field was applied, the index delta of thermal stability, and the reversal current density Jc0(MA/cm$^2$) were found.

Note that delta and Jc0 were found by measuring the pulse width dependence of the storage layer magnetization reversal current.

TABLE 1

| | Pt atomic % | MR-H WAVE-FORM Type | DROP IN TMR @H = 2.0 kOe | Δ | Jc0 (MA/cm$^2$) |
|---|---|---|---|---|---|
| SPECIFIC EXAMPLE 1 | 0 | 1 | 0 | 42 | 3.3 |
| SPECIFIC EXAMPLE 2 | 19.5 | 1 | 0 | 42 | 3.3 |
| SPECIFIC EXAMPLE 3 | 28 | 1 | 0 | 42 | 3.3 |
| SPECIFIC EXAMPLE 4 | 32.5 | 2 | 5 | 42 | 3.4 |
| SPECIFIC EXAMPLE 5 | 37 | 3 | 10 | 42 | 3.45 |
| COMPARATIVE EXAMPLE 1 | 42 | 4 | 100 | 39 | 4.6 |

Here, the "MR-H waveform type" in Table 1 will be described with reference to FIG. 9.

In FIG. 9, FIG. 9A shows Type 1, Type 2, and Type 3 as MR-H waveform types. In FIG. 9B, Type 4 is shown as a MR-H waveform type.

A MR-H curve is generated by measuring change in resistance while applying an external magnetic field to a storage element sample, and MR(TMR) is found by dividing (resistance in a high resistance state—resistance in a low resistance state) by the resistance in the low resistance state and multiplying the result by 100.

In the MR-H curve as Type 1 shown in FIG. 9A, a perfectly square waveform is maintained when the applied external magnetic field is in a range of plus or minus 3.0 kOe, and is therefore an ideal MR-H curve.

On the other hand, with both Type 2 and Type 3, a fall in squareness, that is, a drop in MR, is observed when the applied external magnetic field is in the vicinity of plus 2.0 kOe. In more precise terms, although deterioration in the laminated ferri coupling strength is observed in the vicinity of 2.0 kOe for both Type 2 and Type 3, since MR maintains a value that is significantly larger than zero when 3.0 kOe is applied, the laminated ferri coupling strength is still comparatively high. As shown in the drawing, the extent of the drop in MR when 2.0 to 3.0 kOe is applied is larger for Type 3 than for Type 2, and therefore Type 2 has a more favorable laminated ferri coupling strength than Type 3.

Unlike Types 1 to 3, with Type 4 shown in FIG. 9B, MR drops to zero when the applied magnetic field is in the vicinity of 2.0 kOe. This corresponds to the CoFeB in the pinned magnetization layer 12 being completely reversed in the vicinity of 2.0 kOe. That is, this corresponds to breakdown of the laminated ferri-pinned construction of the pinned magnetization layer 12.

As can be understood from such results, since the laminated ferri coupling is weak, Type 4 is not desirable from the viewpoints of maintaining thermal stability and reducing power consumption.

From the results in Table 1 given above, it can be understood that the type of MR-H waveform changes if the Pt atomic concentration of CoPt is varied. More specifically, it can be understood that the laminated ferri coupling strength is strong in compositions with little Pt and becomes weaker as Pt increases.

From the results in Table 1, it can be understood that the boundary between Type 3 and Type 4 for the MR-H waveform is present between Pt atomic % of 37% (Specific Example 5) and 42% (Comparative Example 1), and that a large difference in the drop in TMR of between 10 and 100 also appears. From such results also, it can be understood that it is desirable for the Pt atomic concentration to be 40 atomic % or below as described earlier from the viewpoint of maintaining the laminated ferri coupling strength.

Also, from the results in Table 1, it can be confirmed that a large difference in delta and Jc0 characteristics was not observed when Pt is in a range of 0 to 37 atomic % as the Specific Example 1 to Specific Example 5 (i.e., for Type 1 to Type 3 samples). Conversely, for the samples as Comparative Example 1 where Pt=42 atomic % and a Type 4 waveform was obtained, delta slightly falls and there was an increase of around fifty percent in Jc0. From such results, it can be understood that there is large correlation between the MR-H waveform (in particular, the laminated ferri coupling strength) and the spin injection magnetization reversal characteristics. The cause of the differences in spin injection magnetization reversal characteristics is believed to be as follows. When a spin-polarized current is injected into the storage element, if the laminated ferri coupling strength is weak, the magnetization will fluctuate not only in the storage layer 14 but also in the pinned magnetization layer 12.

Note that although detailed description of the results is omitted, it was confirmed that completely the same tendencies as the experiments described above were obtained even when the perpendicular magnetization film in the pinned magnetization layer 12 that does not contact the intermediate layer 13 (tunnel barrier insulating layer) is formed as CoPd, FePt, and FePd, that is, a combination of a ferromagnetic 3d transition metal element that is a ferromagnetic element out of 3d transition metal elements and a Pt group metal element.

Note that aside from Co and Fe, Ni can also be given as an example of the ferromagnetic 3d transition metal element mentioned above.

Experiment 3

Although experiment results have been described for the pinned magnetization layer 12 with a CoPt/Ru/CoFeB configuration, samples were also produced and tested for a laminated construction of CoPt/Ru/CoPt/CoFeB which is intended to further increase the laminated ferri coupling strength.

FIG. 10 shows the layered construction of the storage element samples used in Experiment 3. As shown in the drawing, such samples are the same as the sample shown in FIG. 7 in that the base layer 11, the pinned magnetization layer 12, the intermediate layer 13, the storage layer 14, and the metal cap layer 15 are disposed in that order from the bottom.

In this experiment, samples where the layered construction of the pinned magnetization layer 12 was set at CoPt:2 nm, Ru:0.8 nm, CoPt:xnm, CoFeB:(2−x)nm were produced and the characteristics of such samples were investigated.

Note that in this experiment also, investigations were carried out using a wafer on which only the storage element 3 with the construction shown in FIG. 10 was formed.

More specifically, a thermally-oxidized film with a thickness of 300 nm was formed on a silicon substrate with a thickness of 0.725 mm and the storage element 3 with the configuration shown in FIG. 10 was then formed on top.

In this experiment, the film configurations aside from the pinned magnetization layer 12 (i.e., the film configurations of the base layer 11, the intermediate layer 13, the storage layer 14, and the cap layer 15) are the same as in Experiment 2 described earlier.

In this experiment, the composition of CoPt was fixed at Pt=42 atomic % and samples were respectively produced where x(nm) given above was x=0, x=0.5, and x=1.0.

Here, the samples where x=0.5 were set as "Specific Example 6" and the samples where x=1.0 were set as "Specific Example 7". Since samples where x=0 are the same as Comparative Example 1 described earlier, such samples are indicated in this experiment also as "Comparative Example 1".

Note that in this case also, Pt=0 atomic % refers to a laminated construction of Pt:5 nm/Co:2 nm.

For the samples of Specific Example 6, Specific Example 7, and Comparative Example 1 described above, the MR-H waveform type, the drop in TMR when a 2.0 kOe external magnetic field was applied, the index delta of thermal stability, and the reversal current density Jc0 (MA/cm$^2$) were found in the same way as in Table 1 earlier.

The results are shown in Table 2 below.

TABLE 2

| | X | MR-H WAVE-FORM Type | DROP IN TMR @H = 2.0 kOe | Δ | Jc0 (MA/cm$^2$) |
| --- | --- | --- | --- | --- | --- |
| COMPARATIVE EXAMPLE 1 | 0 | 4 | 100 | 39 | 4.6 |
| SPECIFIC EXAMPLE 6 | 0.5 | 1 | 0 | 42 | 3.0 |
| SPECIFIC EXAMPLE 7 | 1.0 | 1 | 0 | 42 | 3.2 |

From the results in Table 2, with the samples of Embodiment 6 and Embodiment 7 with the CoPt/Ru/CoPt/CoFeB construction, it can be understood that regardless of Pt being set at 42 atomic %, the MR-H waveform type is Type 1 and the drop in TMR when an external magnetic field of 2.0 kOe is applied is 0.

From such results, it can be understood that by using a CoPt/Ru/CoPt/CoFeB construction (that is, a construction where both the upper surface and the lower surface of the non-magnetic layer in the pinned magnetization layer 12 contact ferromagnetic materials that use at least one type of each of a Pt group metal element and a ferromagnetic 3d transition metal element), laminated ferri coupling strength is ensured even with a Pt atomic concentration for which the laminated ferri coupling strength was not ensured for a CoPt/Ru/CoFeB construction (Comparative Example 1). In other words, by using a construction where both the upper surface and a lower surface of a non-magnetic layer in the pinned magnetization layer 12 that has a CoPt/Ru/CoPt/CoFeB construction contact magnetic materials that use at least one type of each of a Pt group metal element and a ferromagnetic 3d transition metal element, laminated ferri coupling strength is improved compared to a case where a construction where only the lower surface of the non-magnetic layer in the pinned magnetization layer 12 that has a CoPt/Ru/CoFeB construction contacts a magnetic material that uses at least one type of each of a Pt group metal element and a ferromagnetic 3d transition metal element.

The improvement in laminated ferri coupling strength when using a CoPt/Ru/CoPt/CoFeB construction in this way is due to the presence of a configuration called a CoPt/CoFeB/MgO tunnel barrier) within such construction. That is, although CoFeB is perpendicularly magnetized using only interface magnetic anisotropy in the case of the CoPt/Ru/CoFeB construction used in Experiment 2 earlier, by using a CoPt/CoFeB configuration, the laminated ferri coupling strength itself becomes stronger from the ability to use perpendicular magnetic anisotropy based on the crystal magnetic anisotropy of CoPt.

By introducing a material (Pt) with a large damping constant in the magnetic layer immediately below the MgO barrier, there are the merits of an increase in stability against spin injection and an increase in spin torque resistance as the pinned magnetization layer 12.

From the results in Table 2 above, from the relationship between delta and Jc0, it is possible to confirm that an effect of a reduction in Jc0 is obtained due to the addition to the pinned magnetization layer 12 of Pt whose damping constant is high.

Here, even with the CoPt/Ru/CoPt/CoFeB construction, it is necessary to make the atomic % of Pt in the CoPt lower than the Co, and more preferably by setting the Pt atomic % at 40% or below, a larger Hcoupling and a more stable laminated ferri coupling strength are realized in the same way as with a CoPt/Ru/CoFeB construction.

4. Modifications

Although embodiments of the present disclosure have been described above, the present disclosure is not limited to the specific examples described above.

As one example, the construction of the storage element according to the embodiments of the present disclosure has been described as a magnetoresistance effect element configuration such as TMR element, such magnetoresistance effect element as a TMR element is not limited to the storage apparatus described above and can also be applied to various electronic appliances, electrical appliances, and the like, such as a magnetic head, a hard disk drive equipped with such magnetic head, and an integrated circuit chip, as well as to a personal computer, a mobile terminal, a mobile phone, and a magnetic sensor appliance.

As one example FIG. 12A and FIG. 12B show an example where a magnetoresistance effect element 101 using the construction of the storage element 3 described above is applied to a composite magnetic head 100. Note that FIG. 12A is a perspective view of the composite magnetic head 100 that has been partially cut away to show the internal construction and FIG. 12B is a cross-sectional view of the composite magnetic head 100.

The composite magnetic head 100 is a magnetic head used in a hard disk apparatus or the like and has a magnetoresistance effect-type magnetic head according to an embodiment of the present disclosure formed on a substrate 122 and has an inductive magnetic head formed so as to be laminated on the magnetoresistance effect-type magnetic head. Here, the magnetoresistance effect-type magnetic head operates as a reproduction head and the inductive magnetic head operates as a recording head. That is, the composite magnetic head 100 is configured by combining a reproduction head and a recording head.

The magnetoresistance effect-type magnetic head provided in the composite magnetic head 100 is a so-called "shield-type MR head" and includes a first magnetic shield 125 formed on the substrate 122 with an insulating layer 123 in between, the magnetoresistance effect-type magnetic element 101 formed on the first magnetic shield 125 with the insulating layer 123 in between, and a second magnetic shield 127 formed on the magnetoresistance effect-type magnetic element 101 with the insulating layer 123 in between. The insulating layer 123 is made of an insulating material such as $Al_2O_3$ or $SiO_2$.

The first magnetic shield 125 magnetically shields the lower layer side of the magnetoresistance effect-type magnetic element 101 and is composed of a soft magnetic material such as Ni—Fe. The magnetoresistance effect-type magnetic element 101 is formed on the first magnetic shield 125 with the insulating layer 123 in between.

The magnetoresistance effect-type magnetic element 101 functions in the magnetoresistance effect-type magnetic head as a magnetism sensitive device that detects a magnetic signal from a magnetic recording medium. The magnetoresistance effect-type magnetic element 101 has the same film configuration (layered construction) as the storage element 3 described earlier.

The magnetoresistance effect-type magnetic element 101 is formed in a substantially rectangular shape with one side surface exposed to the facing surface of a magnetic recording medium. Bias layers 128, 129 are disposed at both ends of the magnetoresistance effect-type magnetic element 101. Connection terminals 130, 131 that are connected to the bias layers 128, 129 are also formed. A sense current is supplied to the magnetoresistance effect-type magnetic element 101 via the connection terminals 130, 131.

In addition, the second magnetic shield 127 is provided on the bias layers 128, 129 with the insulating layer 123 in between.

The inductive magnetic head formed so as to be laminated on the magnetoresistance effect-type magnetic head as described above includes a magnetic core, which is composed of the second magnetic shield 127 and an upper core 132, and a thin-film coil 133 formed so as to be wound around such magnetic core.

The upper core 132 forms a closed magnetic circuit together with the second magnetic shield 127, forms the magnetic core of an inductive magnetic head, and is made of a soft magnetic material such as Ni-Fe. Here, front end portions of the second magnetic shield 127 and the upper core 132 are exposed to the facing surface of a magnetic recording medium and at rear end portions thereof, the second magnetic shield 127 and the upper core 132 contact each other. Here, the front end portions of the second magnetic shield 127 and the upper core 132 are formed so that a specific gap g is provided between the second magnetic shield 127 and the upper core 132 at the magnetic recording medium facing surface.

That is, in the composite magnetic head 100, the second magnetic shield 127 not only magnetically shields the upper layer side of a magnetoresistance effect element 126 but also serves as the magnetic core of the inductive magnetic head, so that the magnetic core of the inductive magnetic head is constructed by the second magnetic shield 127 and the upper core 132. The gap g forms the recording magnetic gap of the inductive magnetic head.

The thin-film coil 133 embedded in the insulating layer 123 is formed on the second magnetic shield 127. Here, the thin-film coil 133 is formed so as to be wound around a magnetic core made up of the second magnetic shield 127 and the upper core 132. Although not illustrated, both end portions of the thin-film coil 133 are exposed to the outside and terminals formed at both ends of the thin-film coil 133 form external connection terminals of the inductive magnetic head. That is, when recording a magnetic signal on a magnetic recording medium, a recording current is supplied to the thin-film coil 133 from such external connection terminals.

As described above, the laminated structure as a storage element according to the embodiments of the present disclosure is capable of being used as a reproduction head for a magnetic recording medium, that is, as a magnetism sensitive element that detects a magnetic signal from a magnetic recording medium.

By applying the laminated structure as a storage element according to the embodiments of the present disclosure to a magnetic head, it is possible to realize a highly reliable magnetic head with superior thermal stability.

Although the construction of the storage element 3 composed of the base layer 11, the pinned magnetization layer 12, the intermediate layer 13, the storage layer 14, and the cap layer 15 has been described as an example, as the storage element (and magnetic head) according to an embodiment of the present disclosure, it is also possible to use a construction, as a storage element 3#, where the pinned magnetization layer 12 is divided and disposed on both the bottom and top of the storage layer 14 as in the base layer 11-lower pinned magnetization layer 12L-lower intermediate layer 13L-storage layer 14-upper intermediate layer 13U-upper pinned magnetization layer 12U-cap layer 15 construction shown in FIG. 11.

The direction of magnetization M12 of the lower pinned magnetization layer 12L and the direction of magnetization of the upper pinned magnetization layer 12U are both shown in FIG. 11, with the directions of the magnetizations M12L and M12U being opposite in the illustrated example.

Also in such case, the lower intermediate layer 13L and the upper intermediate layer 13U are composed of an oxide film of MgO or the like in the same way as the intermediate layer 13.

Even with a configuration where the pinned magnetization layer 12 is divided and disposed on the top and bottom in this way, by using, for the upper and lower pinned magnetization layers 12, the same construction as the pinned magnetization layer 12 described earlier, that is "a laminated ferri-pinned construction made up of at least two ferromagnetic layers and a non-magnetic layer, where the magnetic material in the pinned magnetization layer that contacts the insulating layer is configured using a CoFeB magnetic layer, the magnetic material in the pinned magnetization layer that does not contact the insulating layer is an alloy or a laminated construction using at least one type of each of a Pt group metal element and a ferromagnetic 3d transition element, and the atomic concentration of the Pt group metal element is lower than the ferromagnetic 3d transition element", the effect of improving the thermal stability can be obtained in the same way.

Also, although a case where the CoFeB composition of the storage layer 14 and the pinned magnetization layer 12 is the same has been described as an example in the above explanation, such composition may have various other configurations within a range that does not depart from the scope of the present disclosure.

Although the CoFeB in the pinned magnetization layer 12 is a single layer in the above explanation, it is possible to add elements and oxides in a range where there is no significant drop in the coupling magnetic field.

Here, Ta, Hf, Nb, Zr, Cr, Ti, V, and W can be given as examples of elements to be added and MgO, AlO, and SiO2 can be given as examples of oxides.

The base layer 11 and the cap layer 15 may be a single material or may be a laminated construction of a plurality of materials.

The present disclosure can also be applied to a so-called "top-laminated ferri-type STT-MRAM" and in such case, if the CoPt composition is in the range of the present disclosure, the effect of improving the thermal stability can be obtained in the same way.

Additionally, the present technology may also be configured as below.

(1) A storage element including:
a layered construction including
a storage layer that has magnetization perpendicular to a surface of the storage layer and whose direction of magnetization is changed corresponding to information,
a pinned magnetization layer that has magnetization perpendicular to a surface of the pinned magnetization layer and serves as a standard for information stored in the storage layer, and
an insulating layer that is composed of a non-magnetic material and is provided between the storage layer and the pinned magnetization layer,
wherein recording of information in the storage layer is carried out by changing the direction of magnetization of the storage layer by injecting spin-polarized electrons in a laminating direction of the layered construction,
wherein the pinned magnetization layer has a laminated ferri-pinned construction composed of at least two ferromagnetic layers and a non-magnetic layer,
wherein a magnetic material in the pinned magnetization layer that contacts the insulating layer is configured using a CoFeB magnetic layer, and
wherein a magnetic material in the pinned magnetization layer that does not contact the insulating layer is one of an alloy and a laminated structure using at least one type of each of a Pt group metal element and a ferromagnetic 3d transition metal element that is a ferromagnetic element out of 3d transition metal elements, and an atomic concentration of the Pt group metal element is lower than an atomic concentration of the ferromagnetic 3d transition metal element.

(2) The storage element according to (1),
wherein in the magnetic material that uses the at least one type of each of the Pt group metal element and the ferromagnetic 3d transition metal element, the atomic concentration of the Pt group metal element is 40% or below.

(3) The storage element according to (1) or (2),
wherein at least one of Pt and Pd is used as the Pt group metal element.

(4) The storage element according to any one of (1) to (3),
wherein at least one of Co and Fe is used as the ferromagnetic 3d transition metal element.

(5) The storage element according to any one of (1) to (4),
wherein both an upper surface and a lower surface of the non-magnetic layer in the pinned magnetization layer contact the magnetic material that uses the at least one type of each of the Pt group metal element and the ferromagnetic 3d transition metal element.

REFERENCE SIGNS LIST 1 gate electrode
2 element separating layer
3, 3# storage element
4 contact layer
6 bit line
7 source region
8 drain region
9 wire
10 semiconductor substrate
11 base layer
12 pinned magnetization layer
12L lower pinned magnetization layer
12U upper pinned magnetization layer
13 intermediate layer
13L lower intermediate layer
13U upper intermediate layer
14 storage layer
15 cap layer

The invention claimed is:

1. A storage element comprising:
a layer structure including
a first layer having a first magnetization state;
a second layer having a second magnetization state; and
an intermediate layer provided between the first layer and the second layer,
wherein the second layer includes at least a first magnetic layer, a second magnetic layer, and a non-magnetic layer,
wherein the first magnetic layer contacts the intermediate layer, and
wherein the first layer contacts the intermediate layer and has a magnetization substantially perpendicular to a surface of the first layer.

2. The storage element according to claim 1, wherein the first magnetic layer includes Co, Fe, and B.

3. The storage element according to claim 1, wherein the second magnetization state is a fixed magnetization state.

4. The storage element according to claim 1, wherein the first magnetization state is configured to be changed by a current.

5. The storage element according to claim 1, wherein the intermediate layer includes one or more of magnesium oxide, aluminum oxide, aluminum nitride, SiO2, Bi2O3, MgF2, CaF, SrTiO2, AlLaO3, and AlNO.

6. The storage element according to claim 1, wherein a thickness of the intermediate layer is no more than 1.5 nm.

7. The storage element according to claim 1, wherein the second magnetic layer does not contact the intermediate layer, wherein the second magnetic layer includes one or both of a Pt group metal element and a ferromagnetic 3d transition metal element, and wherein an atomic concentration of the Pt group metal element is lower than an atomic concentration of the ferromagnetic 3d transition metal element.

8. The storage element according to claim 7, wherein the second magnetic layer includes CoPt.

9. The storage element according to claim 7, wherein the atomic concentration of the Pt group metal element is no more than 40%.

10. The storage element according to claim 7, wherein the Pt group metal element includes at least one or both of Pt and Pd.

11. The storage element according to claim 7, wherein the second magnetic layer includes an alloy or a laminated structure.

12. A memory comprising:
a storage element; and
a first wire and a second wire that intersects the first wire;
wherein the storage element includes
a layer structure including
a first layer having a first magnetization state;
a second layer having a second magnetization state; and
an intermediate layer provided between the first layer and the second layer,
wherein the second layer includes at least a first magnetic layer, a second magnetic layer, and a non-magnetic layer,
wherein the first magnetic layer contacts the intermediate layer, and wherein the first layer contacts the intermediate layer and has a magnetization substantially perpendicular to a surface of the first layer.

13. The memory according to claim 12, wherein the first magnetic layer includes Co, Fe, and B.

14. The memory according to claim 12, wherein the second magnetization state is a fixed magnetization state.

15. The memory according to claim 12, wherein the first magnetization state is configured to be changed by a current.

16. The memory according to claim 12, wherein the intermediate layer includes one or more of magnesium oxide, aluminum oxide, aluminum nitride, SiO2, Bi2O3, MgF2, CaF, SrTiO2, AlLaO3, and AlNO.

17. The memory according to claim 12, wherein a thickness of the intermediate layer is no more than 1.5 nm.

18. The memory according to claim 12, wherein the second magnetic layer does not contact the intermediate layer, wherein the second magnetic layer includes one or both of a Pt group metal element and a ferromagnetic 3d transition metal element, and wherein an atomic concentration of the Pt group metal element is lower than an atomic concentration of the ferromagnetic 3d transition metal element.

* * * * *